US012568618B2

(12) United States Patent

Yu et al.

(10) Patent No.: US 12,568,618 B2
(45) Date of Patent: Mar. 3, 2026

(54) SELECTIVE ETCH STOP FOR WORDLINE CONTACTS IN VERTICAL 3D NAND STAIRCASE REGIONS

(71) Applicant: Intel NDTM US LLC, Santa Clara, CA (US)

(72) Inventors: Hongpeng Yu, Liaoning (CN); Yong Chen, Liaoning (CN); Sijia Li, Liaoning (CN); Chao Gao, Liaoning (CN); Zhiyuan Yu, Liaoning (CN)

(73) Assignee: Intel NDTM US LLC, Santa Clara, CA (US)

( * ) Notice: Subject to any disclaimer, the term of this patent is extended or adjusted under 35 U.S.C. 154(b) by 844 days.

(21) Appl. No.: 17/550,393

(22) Filed: Dec. 14, 2021

(65) Prior Publication Data

US 2023/0164986 A1 May 25, 2023

Related U.S. Application Data

(63) Continuation of application No. PCT/CN2021/132633, filed on Nov. 24, 2021.

(51) Int. Cl.
| | |
|---|---|
| *H10B 41/27* | (2023.01) |
| *G11C 5/02* | (2006.01) |
| *H01L 21/768* | (2006.01) |
| *H01L 23/538* | (2006.01) |
| *H10B 43/27* | (2023.01) |

(52) U.S. Cl.
CPC ............. *H10B 41/27* (2023.02); *G11C 5/025* (2013.01); *H01L 21/768* (2013.01); *H01L 23/5386* (2013.01); *H10B 43/27* (2023.02)

(58) Field of Classification Search
CPC ........ H10B 41/27; H10B 43/27; H10B 41/50; H10B 43/50; G11C 5/025; H01L 21/768; H01L 23/5386
See application file for complete search history.

(56) References Cited

U.S. PATENT DOCUMENTS

| | | | | |
|---|---|---|---|---|
| 5,702,981 A | * | 12/1997 | Maniar ............. | H01L 21/76802 |
| | | | | 438/970 |
| 7,511,372 B2 | * | 3/2009 | Chiu ..................... | H01L 23/473 |
| | | | | 257/706 |
| 8,222,103 B1 | * | 7/2012 | Baars ..................... | H10D 1/716 |
| | | | | 257/532 |
| 8,952,426 B2 | * | 2/2015 | Maejima ................ | H10B 43/20 |
| | | | | 257/214 |
| 8,969,948 B2 | * | 3/2015 | Simsek-Ege ........ | H01L 21/3088 |
| | | | | 257/326 |

(Continued)

*Primary Examiner* — Caleb E Henry
(74) *Attorney, Agent, or Firm* — Morgan, Lewis & Bockius LLP

(57) ABSTRACT

An embodiment of an apparatus may include a substrate, a memory array of vertical 3D NAND strings formed in the substrate, a staircase region formed in the substrate, a polysilicon wordline extended horizontally on a step of the staircase region, a wordline contact extended vertically through the staircase region to make electrical contact with the polysilicon wordline, and an etch stop material formed around the wordline contact and on the polysilicon wordline, where the etch stop material extends to an outside corner of the step, the etch stop material is absent from a sidewall of the step, and the etch stop material is undercut at the outside corner of the step. Other embodiments are disclosed and claimed.

17 Claims, 7 Drawing Sheets

(56) References Cited

U.S. PATENT DOCUMENTS

| | | | | |
|---|---|---|---|---|
| 9,287,271 | B2 * | 3/2016 | Wang | H10B 12/053 |
| 9,437,606 | B2 * | 9/2016 | Makala | H10D 88/01 |
| 9,508,730 | B2 * | 11/2016 | Lee | H10N 70/25 |
| 9,576,973 | B2 * | 2/2017 | Lee | H10B 43/10 |
| 9,613,689 | B1 * | 4/2017 | Takaki | H01L 23/528 |
| 9,679,907 | B1 * | 6/2017 | Kaneko | H10B 43/35 |
| 9,761,481 | B2 * | 9/2017 | Wong | H01L 23/528 |
| 9,875,929 | B1 * | 1/2018 | Shukla | H10B 43/27 |
| 9,893,122 | B2 * | 2/2018 | Tsai | H01L 23/5283 |
| 10,134,752 | B2 * | 11/2018 | Kim | H10B 43/27 |
| 10,141,221 | B1 * | 11/2018 | Lai | H01L 21/76831 |
| 10,163,924 | B2 * | 12/2018 | Ahn | H10B 41/27 |
| 10,217,719 | B2 * | 2/2019 | Watanabe | H01L 23/5389 |
| 10,217,746 | B1 * | 2/2019 | Kim | H10B 63/845 |
| 10,224,340 | B2 * | 3/2019 | Hada | H10B 41/27 |
| 10,290,648 | B1 * | 5/2019 | Zhou | H10B 41/27 |
| 10,354,987 | B1 * | 7/2019 | Mushiga | H01L 24/80 |
| 10,381,443 | B2 * | 8/2019 | Matsumoto | H10B 43/27 |
| 10,504,873 | B1 * | 12/2019 | Chen | H01L 24/09 |
| 10,510,738 | B2 * | 12/2019 | Kim | H01L 24/80 |
| 10,515,897 | B2 * | 12/2019 | Nishikawa | H01L 21/76847 |
| 10,515,907 | B2 * | 12/2019 | Fujita | H10B 43/27 |
| 10,522,624 | B2 * | 12/2019 | Van Houdt | H10N 70/20 |
| 10,559,582 | B2 * | 2/2020 | Nishikawa | H10B 43/27 |
| 10,777,539 | B2 * | 9/2020 | Chu | H01L 23/481 |
| 11,563,021 | B2 * | 1/2023 | Huang | H10B 43/35 |
| 2006/0278990 | A1 * | 12/2006 | Farrar | H01L 21/76813 |
| | | | | 257/E23.145 |
| 2007/0155150 | A1 * | 7/2007 | Kim | H01L 21/76834 |
| | | | | 257/E21.507 |
| 2010/0090286 | A1 * | 4/2010 | Lee | H10D 30/681 |
| | | | | 257/E27.081 |
| 2010/0244191 | A1 * | 9/2010 | Yu | H10D 1/042 |
| | | | | 257/532 |
| 2011/0260328 | A1 * | 10/2011 | Nam | H01L 21/76831 |
| | | | | 257/E23.012 |
| 2013/0037950 | A1 * | 2/2013 | Yu | H01L 23/5226 |
| | | | | 257/E23.021 |
| 2013/0292794 | A1 * | 11/2013 | Pai | H01L 21/76832 |
| | | | | 257/532 |
| 2016/0268263 | A1 * | 9/2016 | Lee | H10B 43/10 |
| 2016/0365352 | A1 * | 12/2016 | Nishikawa | H10B 43/10 |
| 2017/0018459 | A1 * | 1/2017 | Fan | H01L 21/76877 |
| 2017/0053906 | A1 * | 2/2017 | Or-Bach | H10B 43/20 |
| 2017/0162597 | A1 * | 6/2017 | Sharangpani | H01L 21/02178 |
| 2017/0213845 | A1 * | 7/2017 | Baba | H10B 43/27 |
| 2017/0236836 | A1 * | 8/2017 | Huo | H10D 1/00 |
| | | | | 257/324 |
| 2017/0243879 | A1 * | 8/2017 | Yu | H01L 21/32 |
| 2017/0373089 | A1 * | 12/2017 | Kim | H10B 43/27 |
| 2018/0277556 | A1 * | 9/2018 | Kang | H10B 43/10 |
| 2018/0342557 | A1 * | 11/2018 | Mori | H10N 70/823 |
| 2019/0074290 | A1 * | 3/2019 | Xiao | H10D 30/696 |
| 2019/0148294 | A1 * | 5/2019 | Ting | H01L 21/76802 |
| | | | | 257/774 |
| 2019/0229062 | A1 * | 7/2019 | Shin | H01L 21/76832 |
| 2019/0355735 | A1 * | 11/2019 | Kothari | H01L 21/32139 |
| 2020/0013791 | A1 * | 1/2020 | Or-Bach | G11C 11/5628 |
| 2020/0051904 | A1 * | 2/2020 | Tang | H10B 63/00 |
| 2020/0105664 | A1 * | 4/2020 | Han | H01L 21/76897 |
| 2020/0126974 | A1 * | 4/2020 | Liu | H10D 62/292 |
| 2020/0350203 | A1 * | 11/2020 | Fratin | H01L 21/76843 |
| 2020/0388650 | A1 * | 12/2020 | Nardi | G11C 13/0026 |
| 2020/0395407 | A1 * | 12/2020 | Takahashi | H10N 70/066 |
| 2020/0395408 | A1 * | 12/2020 | Takahashi | H10B 63/845 |
| 2020/0402988 | A1 * | 12/2020 | Howder | H10B 43/27 |
| 2020/0403033 | A1 * | 12/2020 | Lilak | H10B 43/50 |
| 2021/0050252 | A1 * | 2/2021 | Zhang | H01L 21/76807 |
| 2021/0265364 | A1 * | 8/2021 | Huang | H10B 43/20 |

* cited by examiner

20

22

21

20

21t

22t

21b

22b

21

40

40

SELECTIVE ETCH STOP FOR WORDLINE CONTACTS IN VERTICAL 3D NAND STAIRCASE REGIONS

CLAIM FOR PRIORITY

This application claims priority to International Patent Application No. PCT/CN2021/132633, filed Nov. 24, 2021 and titled "SELECTIVE REMOVAL OF SIDEWALL MATERIAL FOR 3D NAND INTEGRATION," which is incorporated by references in its entirety for all purposes.

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. With an increased number of tiers in 3D NAND, and increased block size, the minimum data unit that can be erased at once also increases. To reduce the block size, some 3D NAND memory devices may utilize a block-by-deck (BBD) architecture. In an example BBD architecture, the tiers are divided into 3 decks, with 48 write-lines (WLs) in each deck, and the block size is reduced from 144 MB to 48 MB. Decks can be assigned to any combination of quad-level cell (QLC) or single-level cell (SLC) blocks. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
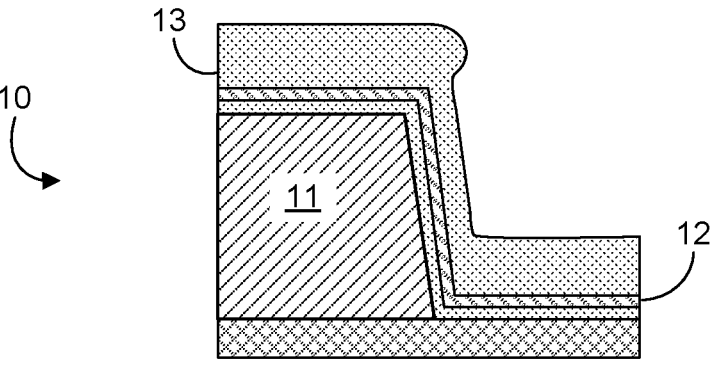
FIGS. 1A to 1C are illustrative diagrams of an example of an process according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Some embodiments provide process technology to remove sidewall materials at a bulk opening area for a 3D NAND integration process. In 3D NAND technology, a film stack gets thicker with more tiers. Some 3D NAND technology involves the formation of a staircase to land wordline (WL) contacts. As 3D NAND technology keeps scaling in an increased number of tiers, the depth of the staircase also increases. Forming contacts with a good landing area on the staircase region may be challenging because each contact needs to land on a different depth (e.g., on different steps of the staircase formation).

Some 3D NAND devices may utilize polysilicon (poly) material for the WLs, which may not be a good etch stop material for the WL contact etch. One example technique to improve the etch stopping capability of a poly WL may include depositing a thick SiN (silicon nitride; also referred to as "nitride" or "Nit") film layer on top of the WL poly after staircase formation for use as an etch stop for the WL contact etch. After the WL contact etch stops on this SiN layer, a punch step is then performed to punch through the SiN layer and stop on the WL poly. This example may improve the contact etch over etch/under etch window significantly.

However, such thick Nit film is only needed at the staircase bottom and top surfaces. The Nit layer at a sidewall of the staircase is not desired and causes downstream process issues. For example, if a downstream process needs to etch through the sidewall Nit film, over etch may occur in the sidewall area due to the residual sidewall Nit film. Some embodiments overcome one or more of the foregoing problems.

Some embodiments may selectively remove the materials at only the sidewall of the staircase. For example, some embodiment may utilize materials with an anisotropic property at a top/bottom of the staircase relative to a sidewall of the staircase, such that the materials at only the sidewall of the staircase may be selectively removed. For example, some embodiments may utilize a silicon nitride film that exhibits a different etch rate on a vertical surface (e.g., the sidewall) as compared to a flat surface (e.g., the steps of the staircase formation). Embodiments may remove the sidewall material completely while leaving a good landing area for the WL contacts, advantageously improving process margin and yield.

Figure 1B:
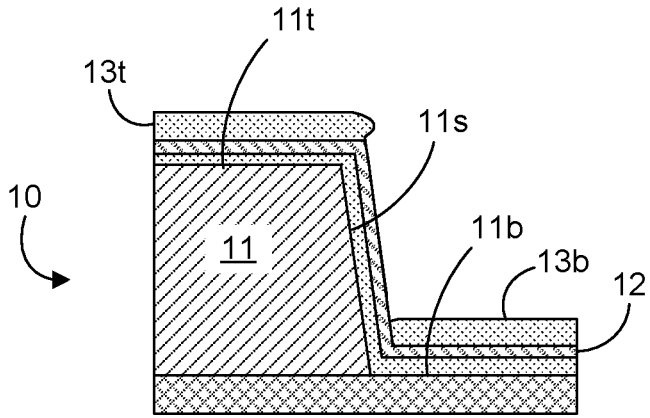
Figure 1C:
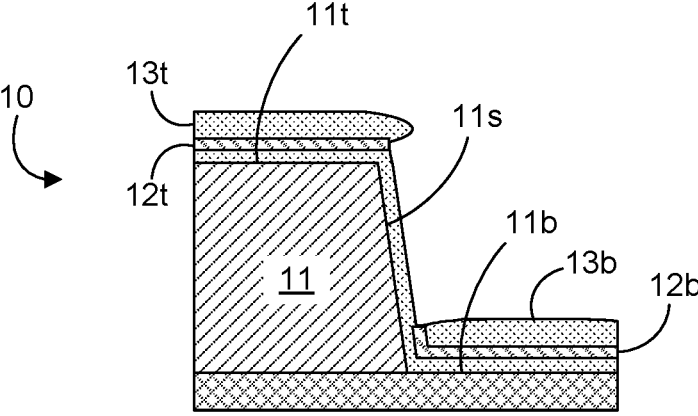

With reference to FIGS. 1A to 1C, an embodiment of a process 10 may start with a substrate with a staircase 11 formed thereon and an etch stop material 12 that covers the staircase 11 (e.g., the steps and the sidewalls). The process 10 may then include depositing non-conformal oxide 13 on the etch stop material 12 (see FIG. 1A). The process 10 may then include wet etching the non-conformal oxide to expose the etch stop material 12 on a sidewall 11s of the staircase 11 while leaving the etch stop material 12 on the steps of the staircase 11 (e.g., a nominal top surface 11t and a nominal bottom surface 11b of the staircase 11) covered with the non-conformal oxide 13t and 13b (see FIG. 1B). The process 10 may then include utilizing phosphoric acid to remove the etch stop material from the sidewall 11s of the staircase 11 while leaving the etch stop material 12t and 12b on the steps of the staircase 11 (see FIG. 1C). Advantageously, further downstream processes may then proceed with the etch stop material completely removed from the sidewall 11s of the staircase 11 while providing a good landing area with the etch stop material 12t and 12b still in place on the steps of the staircase 11. In some embodiments, the etch stop material comprises silicon nitride.

Figure 2A:
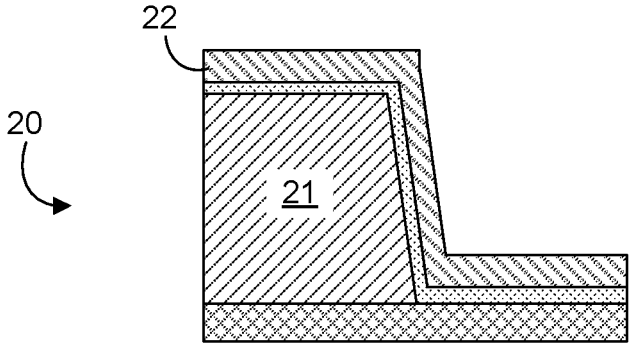
FIGS. 2A to 2B are illustrative diagrams of another example of a process according to an embodiment.
Figure 2B:
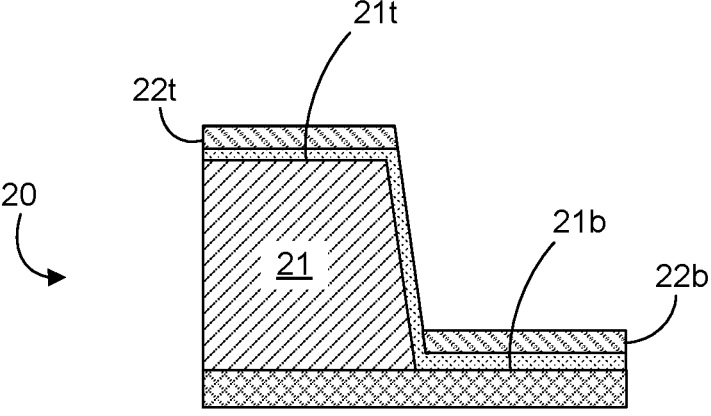

With reference to FIGS. 2A to 2B, an embodiment of a process 20 may start with a substrate with a staircase 21 formed thereon. The process 20 may then include depositing an etch stop material 22 on the staircase 11, where the etch stop material 22 has anisotropic film priority (see FIG. 2A). For example, the film for the etch stop material 22 has a different etch rate on more vertical or angled surfaces (e.g., the sidewalls of the staircase 21) as compared to a flat surface (e.g., the steps of the staircase 21). The process 20 may then include utilizing a phosphoric acid etch to selectively remove the etch stop material 22. Because of the different etch rates, the etch stop material is removed from the sidewall of the staircase 21 while leaving the etch stop material 22*t* and 22*b* on the steps of the staircase 21 (see FIG. 2B). Advantageously, further downstream processes may then proceed with the etch stop material completely removed from the sidewall of the staircase 21 while providing a good landing area with the etch stop material 22*t* and 22*b* still in place on the steps of the staircase 21. In some embodiments, the etch stop material comprises silicon nitride.

Figure 3A:
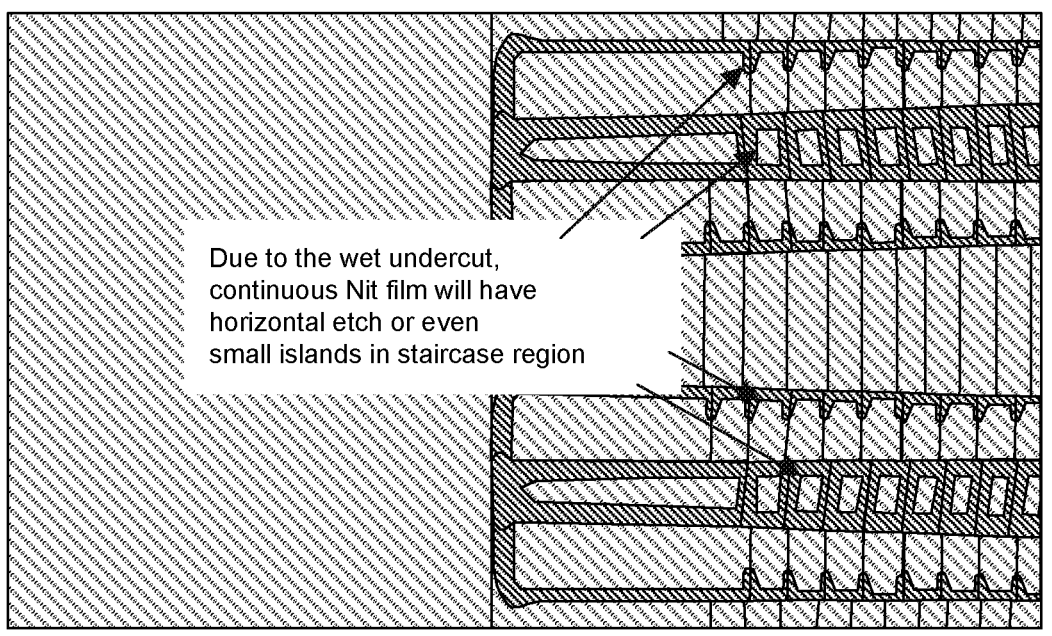
FIGS. 3A to 3C are illustrative diagrams of example representative TEM images according to an embodiment.
Figure 3B:
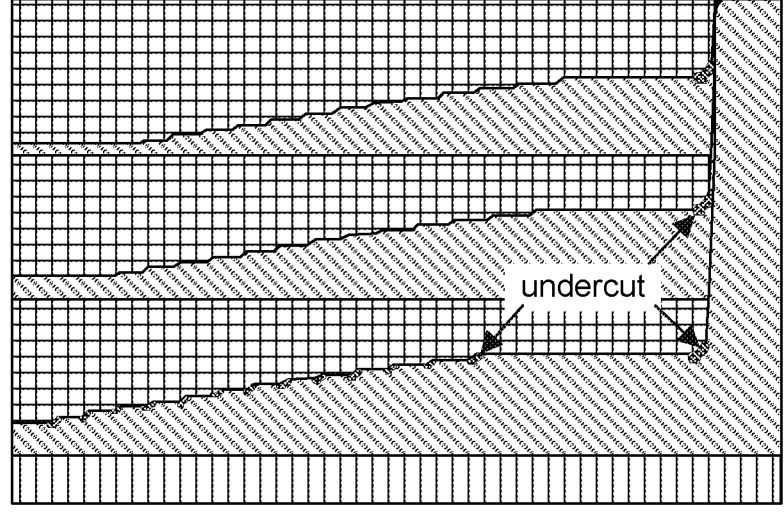
Figure 3C:
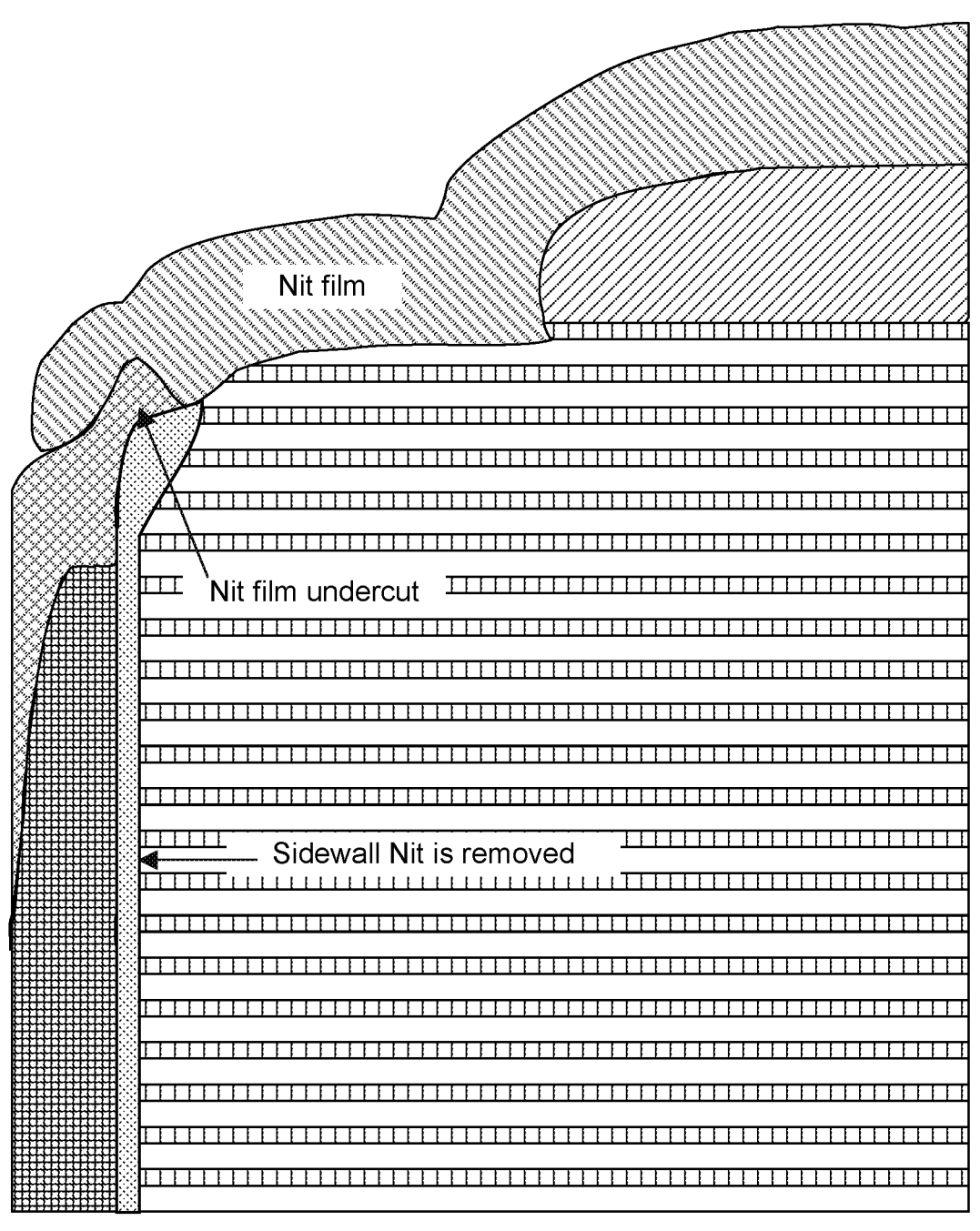

With reference to FIGS. 3A to 3C, embodiments may further result in structural changes in the 3D memory device. As shown in a top view of a staircase formation in FIG. 3A, due to wet undercut, embodiments may exhibit a continuous Nit film with horizontal etch or even small islands in the staircase region. As shown in a side view of the staircase formation in FIG. 3B, embodiments may exhibit undercut in the Nit film at corners of the steps of the staircase formation. As shown in the expanded, detailed side views of the staircase formation in FIG. 3C, all Nit material is removed from the sidewall of the staircase formation, and there is an undercut in the corner of a step of the staircase formation.

Figure 4A:
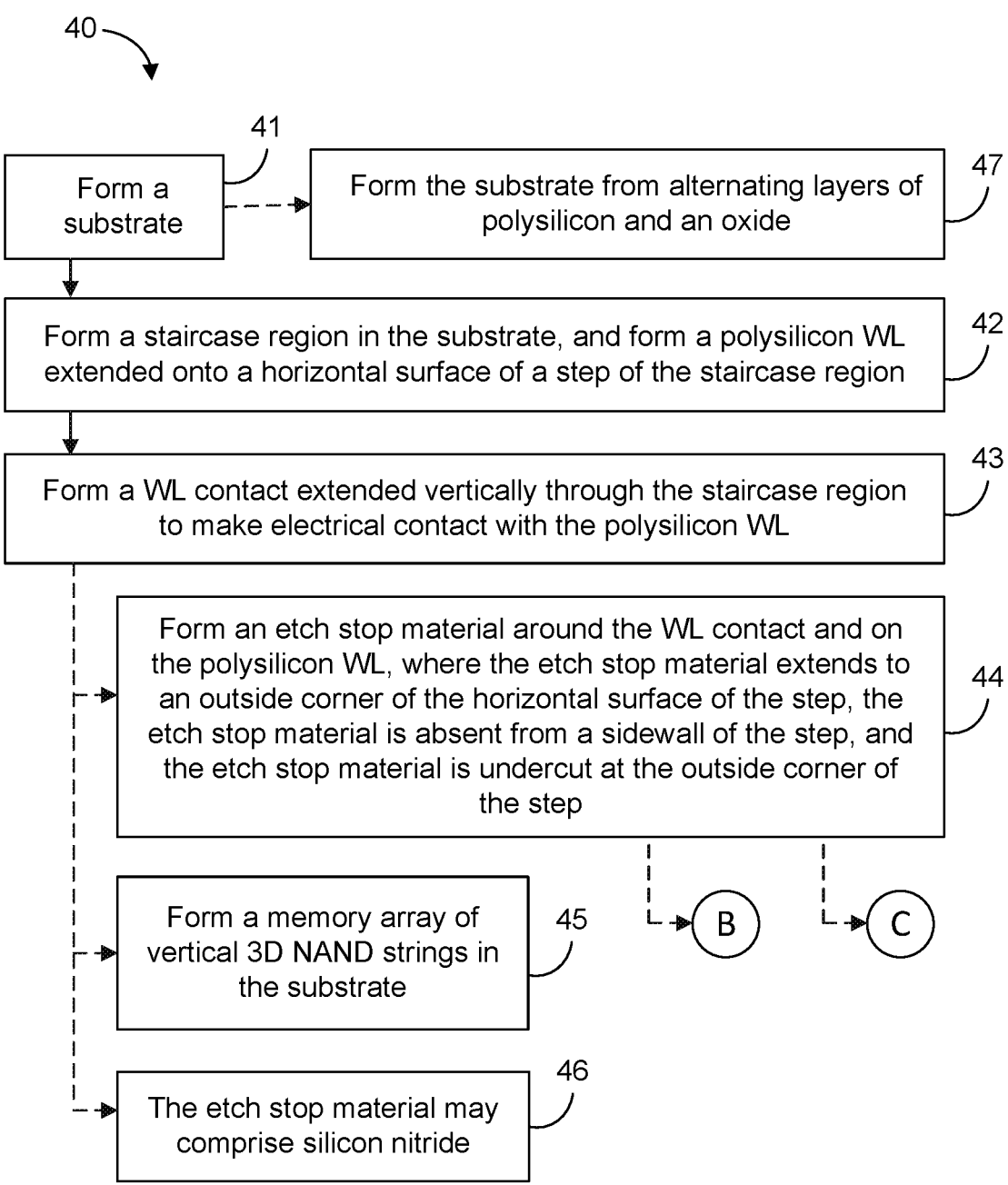
FIGS. 4A to 4C are illustrative diagrams of an example of a method according to an embodiment.
Figure 4B:
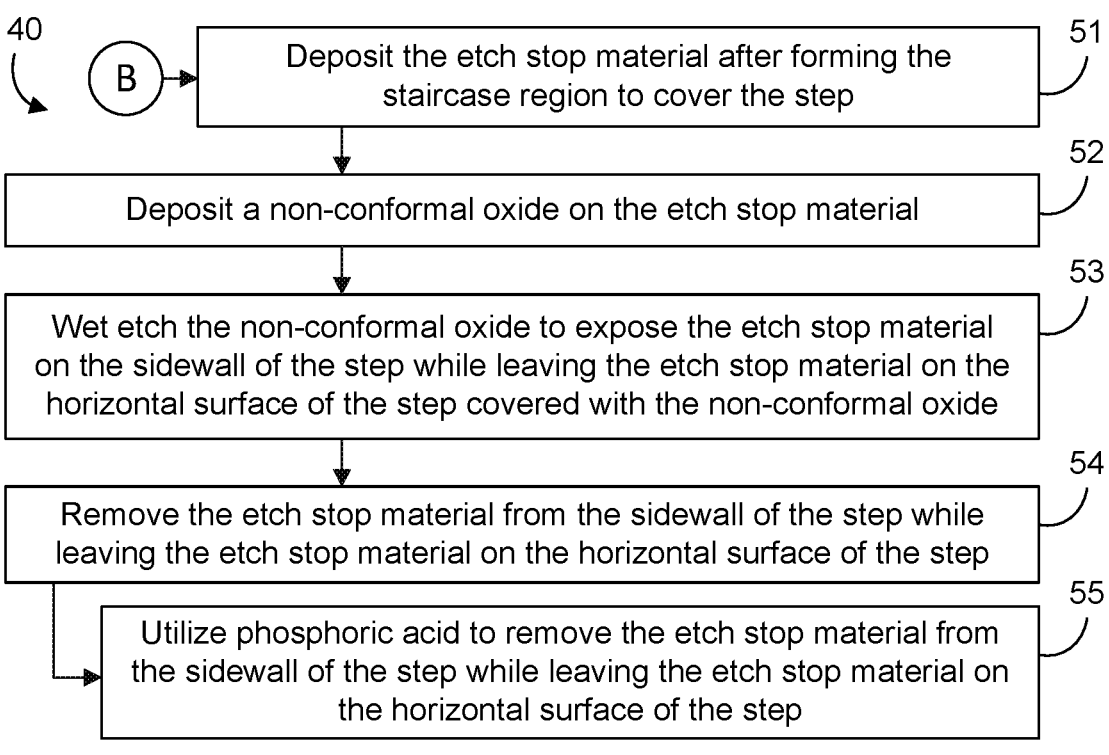
Figure 4C:
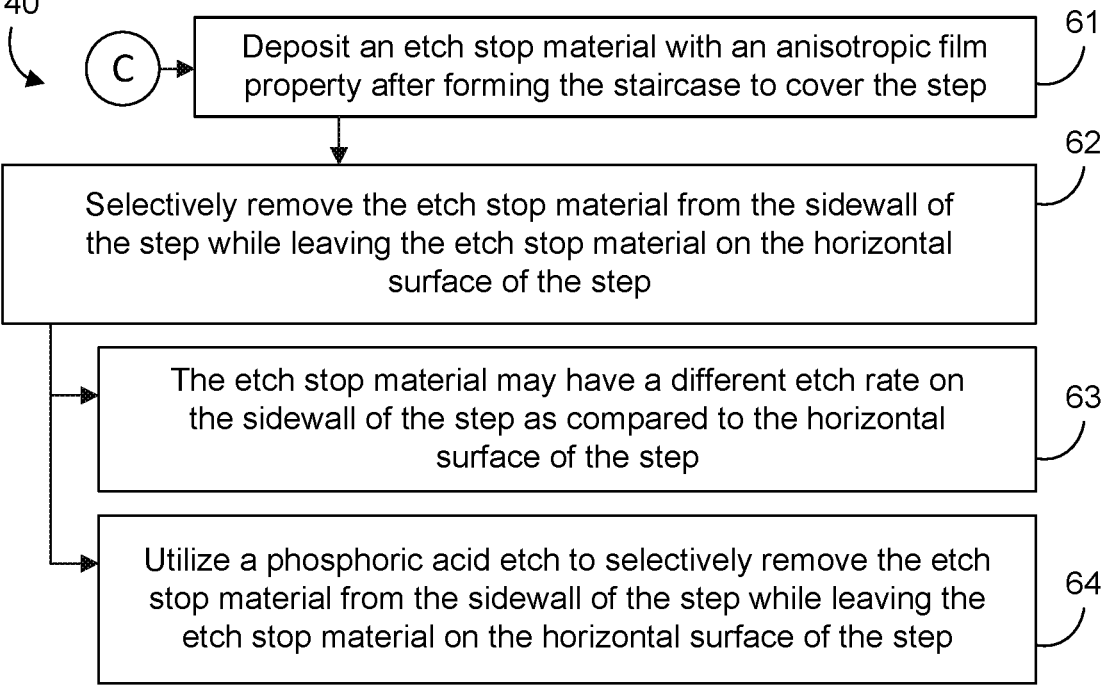

With reference to FIGS. 4A to 4C, an embodiment of a method 40 may include forming a substrate at box 41, forming a staircase region in the substrate, and forming a polysilicon WL extended onto a horizontal surface of a step of the staircase region at box 42, forming a WL contact extended vertically through the staircase region to make electrical contact with the polysilicon WL at box 43, and forming an etch stop material around the WL contact and on the polysilicon WL, where the etch stop material extends to an outside corner of the horizontal surface of the step, the etch stop material is absent from a sidewall of the step, and the etch stop material is undercut at the outside corner of the step at box 44. The method 40 may also include forming a memory array of vertical 3D NAND strings in the substrate at box 45. For example, the etch stop material may comprise silicon nitride at box 46. In some embodiments, the method 40 may include forming the substrate from alternating layers of polysilicon and an oxide at box 47.

Some embodiments of the method 40 may further include depositing the etch stop material after forming the staircase region to cover the step at box 51, depositing a non-conformal oxide on the etch stop material at box 52, wet etching the non-conformal oxide to expose the etch stop material on the sidewall of the step while leaving the etch stop material on the horizontal surface of the step covered with the non-conformal oxide at box 53, and removing the etch stop material from the sidewall of the step while leaving the etch stop material on the horizontal surface of the step at box 54. For example, the method 40 may include utilizing phosphoric acid to remove the etch stop material from the sidewall of the step while leaving the etch stop material on the horizontal surface of the step at box 55.

Alternatively, some embodiments of the method 40 may include depositing an etch stop material with an anisotropic film property after forming the staircase to cover the step at box 61, and selectively removing the etch stop material from the sidewall of the step while leaving the etch stop material on the horizontal surface of the step at box 62. For example, the etch stop material may have a different etch rate on the sidewall of the step as compared to the horizontal surface of the step at box 63. In some embodiments, the method 40 may include utilizing a phosphoric acid etch to selectively remove the etch stop material from the sidewall of the step while leaving the etch stop material on the horizontal surface of the step at box 64.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 5:
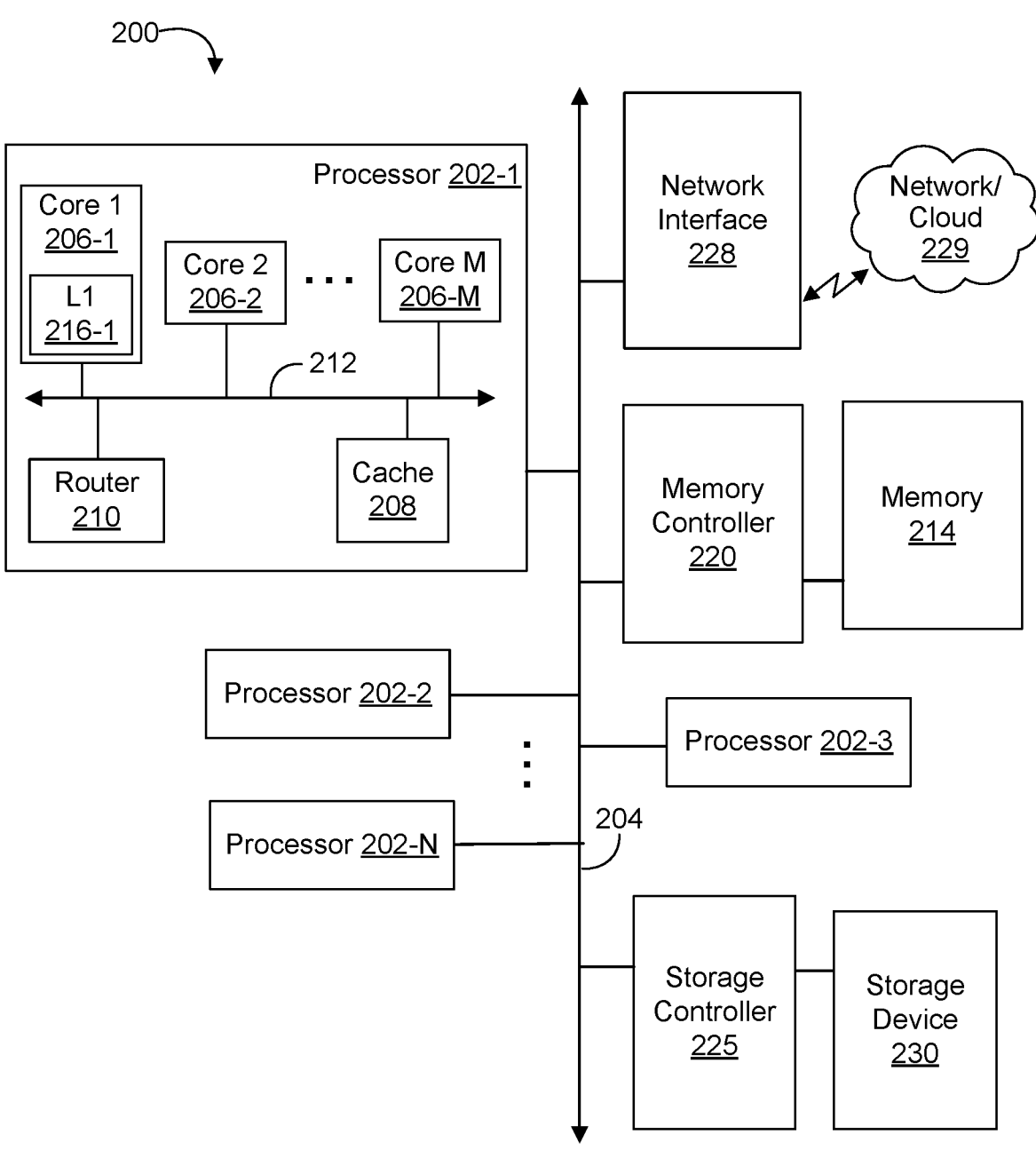
FIG. 5 is a block diagram of an example of a computing system according to an embodiment.

Turning now to FIG. 5, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 6, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 5, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 10, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include 3D NAND memory with undercut etch stop material, as described herein. In particular, the system 200 may include the processors 202 and a 3D memory device (e.g., memory 214, storage device 230, etc.) coupled to the processors 102, where the 3D memory device includes a substrate with alternated layers of conductor material and insulator material (e.g., alternating layers of polysilicon and an oxide), a memory array of vertical 3D NAND strings formed in the substrate, a staircase region formed in the substrate, respective WLs extended horizontally on respective steps of the staircase region, respective WL contacts extended vertically through the staircase region to make electrical contact with the respective WLs, and an etch stop material (e.g., SiN) formed around the WL contacts and on the WLs, wherein the etch stop material extends to an outside corner of the respective steps, the etch stop material is absent from a sidewall of the respective steps, and the etch stop material is undercut at the outside corner of the respective steps. For example, the etch stop material may comprise silicon nitride with an anisotropic film property (e.g., a different etch rate on an angled surface as compared to a horizontal surface).

ADDITIONAL NOTES AND EXAMPLES

Example 1 includes an apparatus, comprising a substrate, a memory array of vertical 3D NAND strings formed in the substrate, a staircase region formed in the substrate, a polysilicon WL extended horizontally on a step of the staircase region, a WL contact extended vertically through the staircase region to make electrical contact with the polysilicon WL, and an etch stop material formed around the WL contact and on the polysilicon WL, wherein the etch stop material extends to an outside corner of the step, the etch stop material is absent from a sidewall of the step, and the etch stop material is undercut at the outside corner of the step.

Example 2 includes the apparatus of Example 1, wherein the etch stop material comprises silicon nitride.

Example 3 includes the apparatus of Example 2, wherein the silicon nitride has an anisotropic film property.

Example 4 includes the apparatus of Example 3, wherein the silicon nitride has a different etch rate on an angled surface as compared to a horizontal surface.

Example 5 includes the apparatus of any of Examples 1 to 4, wherein the substrate comprises alternating layers of polysilicon and an insulator material.

Example 6 includes the apparatus of Example 5, wherein the insulator material comprises an oxide.

Example 7 includes a method, comprising forming a substrate, forming a memory array of vertical 3D NAND strings in the substrate, forming a staircase region in the substrate, forming a polysilicon WL extended onto a horizontal surface of a step of the staircase region, forming a WL contact extended vertically through the staircase region to make electrical contact with the polysilicon WL, and forming an etch stop material around the WL contact and on the polysilicon WL, wherein the etch stop material extends to an outside corner of the horizontal surface of the step, the etch stop material is absent from a sidewall of the step, and the etch stop material is undercut at the outside corner of the step.

Example 8 includes the method of Example 7, further comprising depositing the etch stop material after forming the staircase region to cover the step, depositing a non-conformal oxide on the etch stop material, wet etching the non-conformal oxide to expose the etch stop material on the sidewall of the step while leaving the etch stop material on the horizontal surface of the step covered with the non-conformal oxide, and removing the etch stop material from the sidewall of the step while leaving the etch stop material on the horizontal surface of the step.

Example 9 includes the method of Example 8, further comprising utilizing phosphoric acid to remove the etch stop material from the sidewall of the step while leaving the etch stop material on the horizontal surface of the step.

Example 10 includes the method of Example 7, further comprising depositing an etch stop material with an anisotropic film property after forming the staircase to cover the step, and selectively removing the etch stop material from the sidewall of the step while leaving the etch stop material on the horizontal surface of the step.

Example 11 includes the method of Example 10, wherein the etch stop material has a different etch rate on the sidewall of the step as compared to the horizontal surface of the step.

Example 12 includes the method of any of Examples 10 to 11, further comprising utilizing a phosphoric acid etch to selectively remove the etch stop material from the sidewall of the step while leaving the etch stop material on the horizontal surface of the step.

Example 13 includes the method of any of Examples 7 to 12, wherein the etch stop material comprises silicon nitride.

Example 14 includes the method of any of Examples 7 to 13, further comprising forming the substrate from alternating layers of polysilicon and an oxide.

Example 15 includes a system, comprising a processor and a three-dimensional (3D) memory device coupled to the processor, wherein the 3D memory device includes a substrate with alternated layers of conductor material and insulator material, a memory array of vertical 3D NAND strings formed in the substrate, a staircase region formed in the substrate, respective WLs extended horizontally on respective steps of the staircase region, respective WL contacts extended vertically through the staircase region to make electrical contact with the respective WLs, and an etch stop material formed around the WL contacts and on the WLs, wherein the etch stop material extends to an outside corner of the respective steps, the etch stop material is absent from a sidewall of the respective steps, and the etch stop material is undercut at the outside corner of the respective steps.

Example 16 includes the system of Example 15, wherein the etch stop material comprises silicon nitride.

Example 17 includes the system of Example 16, wherein the silicon nitride has an anisotropic film property.

Example 18 includes the system of Example 17, wherein the silicon nitride has a different etch rate on an angled surface as compared to a horizontal surface.

Example 19 includes the system of any of Examples 15 to 18, wherein the substrate comprises alternating layers of polysilicon and an insulator material.

Example 20 includes the system of Example 19, wherein the insulator material comprises an oxide.

Example 21 includes an apparatus, comprising means for forming a substrate, means for forming a memory array of vertical 3D NAND strings in the substrate, means for forming a staircase region in the substrate, means for forming a polysilicon WL extended onto a horizontal surface of a step of the staircase region, means for forming a WL contact extended vertically through the staircase region to make electrical contact with the polysilicon WL, and means for forming an etch stop material around the WL contact and on the polysilicon WL, wherein the etch stop material extends to an outside corner of the horizontal surface of the step, the etch stop material is absent from a sidewall of the step, and the etch stop material is undercut at the outside corner of the step.

Example 22 includes the apparatus of Example 21, further comprising means for depositing the etch stop material after forming the staircase region to cover the step, means for depositing a non-conformal oxide on the etch stop material, means for wet etching the non-conformal oxide to expose the etch stop material on the sidewall of the step while leaving the etch stop material on the horizontal surface of the step covered with the non-conformal oxide, and means for removing the etch stop material from the sidewall of the step while leaving the etch stop material on the horizontal surface of the step.

Example 23 includes the apparatus of Example 22, further comprising means for utilizing phosphoric acid to remove the etch stop material from the sidewall of the step while leaving the etch stop material on the horizontal surface of the step.

Example 24 includes the apparatus of Example 21, further comprising means for depositing an etch stop material with an anisotropic film property after forming the staircase to cover the step, and means for selectively removing the etch stop material from the sidewall of the step while leaving the etch stop material on the horizontal surface of the step.

Example 25 includes the apparatus of Example 24, wherein the etch stop material has a different etch rate on the sidewall of the step as compared to the horizontal surface of the step.

Example 26 includes the apparatus of any of Examples 24 to 25, further comprising means for utilizing a phosphoric acid etch to selectively remove the etch stop material from the sidewall of the step while leaving the etch stop material on the horizontal surface of the step.

Example 27 includes the apparatus of any of Examples 21 to 26, wherein the etch stop material comprises silicon nitride.

Example 28 includes the apparatus of any of Examples 21 to 27, further comprising means for forming the substrate from alternating layers of polysilicon and an oxide.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An apparatus, comprising:
a substrate;
a memory array of vertical 3D NAND strings formed in the substrate;
a staircase region formed in the substrate;
a polysilicon wordline extended horizontally on a step of the staircase region, the polysilicon wordline having a top surface opposing a rear surface that contacts the step;
a wordline contact extended vertically through the staircase region to make electrical contact with the top surface of the polysilicon wordline; and
an etch stop material formed around the wordline contact and on the top surface of the polysilicon wordline, wherein the etch stop material extends to an outside corner of the step, the etch stop material is absent from a sidewall of the step, and the etch stop material is undercut at the outside corner of the step.

2. The apparatus of claim 1, wherein the etch stop material comprises silicon nitride.

3. The apparatus of claim 2, wherein the silicon nitride has an anisotropic film property.

4. The apparatus of claim 3, wherein the silicon nitride has a different etch rate on an angled surface as compared to a horizontal surface.

5. The apparatus of claim 1, wherein the substrate comprises alternating layers of polysilicon and an insulator material.

6. The apparatus of claim 5, wherein the insulator material comprises an oxide.

7. A system, comprising:
a processor; and
a three-dimensional (3D) memory device coupled to the processor, wherein the 3D memory device includes:
a substrate with alternated layers of conductor material and insulator material;
a memory array of vertical 3D NAND strings formed in the substrate;
a staircase region formed in the substrate;
a plurality of wordlines extended horizontally on respective steps of the staircase region, each of the plurality of wordlines having a top surface opposing a rear surface that contacts a corresponding one of the respective steps;
a plurality of wordline contacts extended vertically through the staircase region to make electrical contact with top surfaces of the plurality of wordlines; and
an etch stop material formed around the plurality of wordline contacts and on the top surface of the plurality of wordlines, wherein the etch stop material extends to an outside corner of each of the respective steps, the etch stop material is absent from a sidewall of each of the respective steps, and the etch stop material is undercut at the outside corner of each of the respective steps.

8. The system of claim 7, wherein the etch stop material comprises silicon nitride.

9. The system of claim 8, wherein the silicon nitride has an anisotropic film property.

10. The system of claim 9, wherein the silicon nitride has a different etch rate on an angled surface as compared to a horizontal surface.

11. The system of claim 7, wherein the substrate comprises alternating layers of polysilicon and an insulator material.

12. The system of claim 11, wherein the insulator material comprises an oxide.

13. A memory device, comprising:

a substrate;

a memory array of vertical 3D NAND strings formed in the substrate;

a staircase region formed in the substrate;

a polysilicon wordline extended horizontally on a step of the staircase region;

a wordline contact extended vertically through the staircase region to make electrical contact with the polysilicon wordline; and an etch stop material formed around the wordline contact and on the polysilicon wordline, wherein the etch stop material extends to an outside corner of the step, the etch stop material is absent from a sidewall of the step, and the etch stop material is undercut at the outside corner of the step;

wherein the etch stop material comprises silicon nitride.

14. The memory device of claim 13, wherein the silicon nitride has an anisotropic film property.

15. The memory device of claim 14, wherein the silicon nitride has a different etch rate on an angled surface as compared to a horizontal surface.

16. The memory device of claim 13, wherein the substrate comprises alternating layers of polysilicon and an insulator material.

17. The memory device of claim 16, wherein the insulator material comprises an oxide.

* * * * *